US010297430B2

(12) United States Patent
Maruko et al.

(10) Patent No.: US 10,297,430 B2
(45) Date of Patent: May 21, 2019

(54) GOLD OR PLATINUM TARGET, AND PRODUCTION METHOD FOR SAME

(71) Applicant: FURUYA METAL CO., LTD., Tokyo (JP)

(72) Inventors: Tomohiro Maruko, Tokyo (JP); Yu Suzuki, Tokyo (JP); Shoji Saito, Tokyo (JP); Amiko Ito, Tokyo (JP); Yusuke Takaishi, Tokyo (JP); Nobuo Kikuchi, Tokyo (JP); Daishi Kaneko, Tokyo (JP); Eiji Matsumoto, Tokyo (JP)

(73) Assignee: FURUYA METAL CO., LTD., Tokyo (JP)

( * ) Notice: Subject to any disclaimer, the term of this patent is extended or adjusted under 35 U.S.C. 154(b) by 311 days.

(21) Appl. No.: 15/112,772

(22) PCT Filed: Jan. 20, 2015

(86) PCT No.: PCT/JP2015/051328
§ 371 (c)(1),
(2) Date: Jul. 20, 2016

(87) PCT Pub. No.: WO2015/111563
PCT Pub. Date: Jul. 30, 2015

(65) Prior Publication Data
US 2016/0343553 A1  Nov. 24, 2016

(30) Foreign Application Priority Data

Jan. 24, 2014  (JP) ................... 2014-011337

(51) Int. Cl.
*C22F 1/14* (2006.01)
*H01J 37/34* (2006.01)
(Continued)

(52) U.S. Cl.
CPC ............. *H01J 37/3426* (2013.01); *B21J 1/02* (2013.01); *B21J 5/002* (2013.01); *B22D 7/005* (2013.01);
(Continued)

(58) Field of Classification Search
CPC ...... H01J 37/3426; H01J 37/3491; B21J 1/02; B21J 5/002; B22D 7/005; C22F 1/14; C23C 14/3414
(Continued)

(56) References Cited

U.S. PATENT DOCUMENTS

2003/0124015 A1* 7/2003 Yamasaki ............. B22F 1/0088
419/28
2004/0025986 A1* 2/2004 Perry ........................ C22C 5/04
148/577
(Continued)

FOREIGN PATENT DOCUMENTS

JP  2002-146521 A  5/2002
JP  2003-213389 A  7/2003
(Continued)

OTHER PUBLICATIONS

International Preliminary Report on Patentability dated Aug. 4, 2016 from corresponding International PCT Application No. PCT/JP2015/051328; 7 pages.
(Continued)

*Primary Examiner* — Patricia L. Hailey
(74) *Attorney, Agent, or Firm* — Ohlandt, Greeley, Ruggiero & Perle, L.L.P.

(57) ABSTRACT

Method of producing a target having a small average crystal grain size of gold or platinum and having a uniform crystal grain size in an in-plane direction of a target surface and a thickness direction of the target in order to further stabilize film deposition characteristics during sputtering. The
(Continued)

method for producing a gold or platinum target includes an ingot production step for casting molten gold or platinum to obtain an ingot; a primary forging step for forging the ingot in a first temperature range; a step for cooling the primary forged ingot to a second temperature range lower than the first temperature range; a secondary forging step for determining six directions for the cooled primary forged ingot and further forging the cooled primary forged ingot from the six directions in the second temperature range; a cross-rolling processing step for adjusting the temperature of the secondary forged ingot to a third temperature range and subjecting the secondary forged ingot to cross-rolling processing to form the secondary forged ingot into a target shape; and a heat treatment step for heat-treating the target-shaped ingot in a fourth temperature range.

11 Claims, 10 Drawing Sheets

(51) Int. Cl.
  *B21J 1/02* (2006.01)
  *C23C 14/34* (2006.01)
  *B21J 5/00* (2006.01)
  *B22D 7/00* (2006.01)

(52) U.S. Cl.
  CPC ............ *C22F 1/14* (2013.01); *C23C 14/3414* (2013.01); *H01J 37/3491* (2013.01)

(58) Field of Classification Search
  USPC ......................................................... 148/430
  See application file for complete search history.

(56) References Cited

U.S. PATENT DOCUMENTS

| | | | | |
|---|---|---|---|---|
| 2008/0232999 | A1* | 9/2008 | Fogel | A44C 27/003 420/465 |
| 2009/0056840 | A1* | 3/2009 | Chen | B22D 27/06 148/557 |
| 2016/0005576 | A1 | 1/2016 | Tsukamoto | |
| 2016/0367729 | A1* | 12/2016 | Shima | A61L 29/02 |
| 2017/0029927 | A1* | 2/2017 | Shima | C22F 1/14 |

FOREIGN PATENT DOCUMENTS

| | | |
|---|---|---|
| JP | 2011-184711 A | 9/2011 |
| WO | 2014136702 A1 | 9/2014 |

OTHER PUBLICATIONS

International Search Report dated Apr. 14, 2015 from corresponding International PCT Application No. PCT/JP2015/051328; 8 pages.
Written Opinion dated Apr. 14, 2015 from corresponding International PCT Application No. PCT/JP2015/051328; 4 pages.

* cited by examiner

GOLD OR PLATINUM TARGET, AND PRODUCTION METHOD FOR SAME

BACKGROUND

1. Field of the Disclosure

The present disclosure relates to a gold sputtering target for forming a gold thin film or a platinum sputtering target for forming a platinum thin film, and a method for producing the same.

2. Discussion of the Background Art

A sputtering target (hereinafter, also referred to as a target) using 99.99% or more high purity gold is used for forming a gold thin film on a semiconductor electrode, a contact of a crystal oscillator, or the like. A target using 99.95% or more high purity platinum is widely used in an application such as a semiconductor magnetic material, because platinum is a special material to reveal magnetic anisotropy by coexistence of platinum with a magnetic material and is chemically inert.

In a method for producing a gold target, it has been proposed that an equiaxial crystals having a crystal grain size of 0.1 mm to 10 mm is formed in order to stabilize film deposition characteristics during sputtering (for example, refer to Patent Document 1).

PRIOR ART DOCUMENTS

Patent Document

Patent Document 1: JP 2002-146521 A

Sputtering is a technique for depositing a film by making argon ionized, causing the ionized argon to collide with a target to make an element fly, and depositing the element on a substrate. The sputtering rate depends on a direction of a crystal plane. Because of this, when the size of a structure on a surface of a target or inside thereof is ununiform or a texture having a specific plane direction is present ununiformly, the sputtering rate is not stable disadvantageously. In order to suppress occurrence of this problem, it is necessary to make a crystal grain size fine and make crystal grains on a surface of a target or inside thereof uniform. However, a crystal of a target of molten high purity gold or platinum easily becomes coarse due to the high purity. As a result, the size of a structure on a surface of the target or inside thereof easily becomes ununiform, and a texture having a specific plane direction is easily present ununiformly.

A method for producing a gold target disclosed in Patent Document 1 discloses that a gold target has a crystal grain size of 0.1 mm to 10 mm and the crystal is an equiaxial crystals. However, the gold target has a large grain size because the crystal grain size is 100 μm or more, and is not sufficient for suppressing occurrence of the above problem.

Therefore, an object of the present disclosure is to produce a target having a small average crystal grain size of gold or platinum and having a uniform crystal grain size in an in-plane direction of a target surface and a thickness direction of the target in order to further stabilize film deposition characteristics during sputtering.

SUMMARY

A stacking-fault energy (hereinafter, also referred to as SFE) of gold is a very small value 45 mJm$^{-2}$. In general, a distortion of a material having a small SFE due to processing is easily accumulated as a stacking fault, and a crystal grain shape formed by recrystallization in this case easily becomes a twin crystal. Therefore, many crystal grains having a twin crystal structure can be produced by introducing many processing distortions and performing a heat treatment in an appropriate temperature range. It has been reported that SFE of platinum is 322 mJm$^{-2}$, larger than that of gold. In general, in a material having SFE at such a level, a distortion due to processing is accumulated in a grain to form a sub-grain. By performing a heat treatment in an appropriate temperature range in this state, many fine crystal grains can be produced by recrystallization through the sub-grain. From the above, the present inventors have conceived of an idea that it is necessary, as a step for obtaining a fine crystal grain of gold or platinum, to introduce many distortions by processing in such an appropriate temperature range as not to cause recovery or recrystallization, and to perform a heat treatment in such an appropriate temperature range as to form a crystal grain but not to coarsen the crystal grain.

A structure of a molten ingot is formed of coarse crystals having a crystal grain size of 1 to 20 mm. These crystals can be fine by forging, rolling processing, or the like. However, it is difficult to make the crystal grain size less than 100 μm, particularly 50 μm or less, and it is difficult to make the crystal grain size uniform on the entire target surface. Therefore, the present inventors have found that an average crystal grain size of gold or platinum can be reduced and the crystal grain size in an in-plane direction of a target surface and a thickness direction of the target can be uniform by performing forging in two stages in an appropriate temperature range in order to introduce many processing distortions, subsequently introducing a distortion such that there is no bias in a plane direction in a rolling in-plane direction by cross rolling, and producing a recrystallized gain using the introduced distortion as a driving force while suppressing coarsening of the crystal grain size by a heat treatment, and have completed the present disclosure. Specifically, a method for producing a gold or platinum target according to the present disclosure is characterized by including an ingot production step for casting molten gold or platinum to obtain an ingot; a primary forging step for forging the ingot obtained by casting in a first temperature range of 0.4 Tm to 0.7 Tm (Tm indicates a melting point (K) of the ingot); a step for cooling the primary forged ingot obtained in the primary forging step to a second temperature range of 0.1 Tm to 0.4 Tm lower than the first temperature range; a secondary forging step for determining six directions of upper, lower, left, right, front, and rear directions for the cooled primary forged ingot and further forging the cooled primary forged ingot from the six directions in the second temperature range; a cross-rolling processing step for adjusting the secondary forged ingot obtained in the secondary forging step to a third temperature range of 0.15 Tm to 0.3 Tm and subjecting the secondary forged ingot to cross-rolling processing to form the secondary forged ingot into a target shape; and a heat treatment step for heat-treating the target-shaped ingot obtained in the cross-rolling processing step in a fourth temperature range of 0.3 to 0.5 Tm.

In the method for producing a gold or platinum target according to the present disclosure, forging performed in the primary forging step is preferably a pre-molding step for forming an ingot shape in order to facilitate forging from the six directions performed in the secondary forging step. By performing such processing in the primary forging step, it is possible to facilitate processing in the secondary forging step which is a subsequent step.

In the method for producing a gold or platinum target according to the present disclosure, in forging from the six directions performed in the secondary forging step, 50 to 80% of the longest side of the ingot is preferably processed. By performing such processing in the secondary forging step, a casting defect generated by melting is removed, an ununiform dissolved structure is made uniform, and a processing distortion is introduced at the same time.

In the method for producing a gold or platinum target according to the present disclosure, in the cross-rolling processing step, the processing degree of cross-rolling processing is preferably 50% or more. By performing such processing in the cross-rolling processing step, formation of a texture biased only toward a specific plane direction can be prevented, and the plane direction can be set at random.

In the method for producing a gold or platinum target according to the present disclosure, the average crystal grain size of the gold or platinum target obtained in the heat treatment step is preferably from 5 to 50 μm, and a tolerance of the crystal grain size in each of the in-plane direction of the target surface and the thickness direction of the target is preferably controlled to be 20% or less. The average crystal grain size of a gold or platinum target can be small, from 5 to 50 μm, and the tolerance of the crystal grain size in each of the in-plane direction of the target surface and the thickness direction of the target can be 20% or less through the above steps.

The gold or platinum target according to the present disclosure is characterized in that the average crystal grain size of gold or platinum is from 5 to 50 μm, and a tolerance of the crystal grain size in each of the in-plane direction of the target surface and the thickness direction of the target is 20% or less.

The present disclosure can make an average crystal grain size of a gold or platinum target smaller and make a crystal grain size in an in-plane direction of a target surface and a thickness direction of the target uniform in order to further stabilize film deposition characteristics during sputtering.

DETAILED DESCRIPTION OF THE PREFERRED EMBODIMENT

Next, the present disclosure will be described in detail by indicating an embodiment, but the present disclosure is not construed as being limited to these descriptions. As long as an effect of the present disclosure is exhibited, the embodiment may be variously modified.

A method for producing a gold or platinum target according to the present embodiment includes (1) an ingot production step for casting molten gold or platinum to obtain an ingot; (2) a primary forging step for forging the ingot obtained by casting in a first temperature range of 0.4 Tm to 0.7 Tm (Tm indicates a melting point (K) of the ingot); (3) a step for cooling the primary forged ingot obtained in the primary forging step to a second temperature range of 0.1 Tm to 0.4 Tm lower than the first temperature range; (4) a secondary forging step for determining six directions of upper, lower, left, right, front, and rear directions for the cooled primary forged ingot and further forging the cooled primary forged ingot from the six directions in the second temperature range; (5) a cross-rolling processing step for adjusting the secondary forged ingot obtained in the secondary forging step to a third temperature range of 0.15 Tm to 0.3 Tm and subjecting the secondary forged ingot to cross-rolling processing to form the secondary forged ingot into a target shape; and a heat treatment step for heat-treating the target-shaped ingot obtained in the cross-rolling processing step in a fourth temperature range of 0.3 to 0.5 Tm.

(Ingot Production Step)

As gold serving as a raw material of an ingot, 99.99% or more high purity gold is preferably used. As platinum serving as a raw material of an ingot, 99.95% or more high purity platinum is preferably used. Gold or platinum is melted using a high-frequency furnace, an electric furnace, or a plasma melting furnace in an air atmosphere, an inert gas atmosphere, or vacuum. When a mold is used, a cast iron rectangular mold or round mold can be used. However, a carbon rectangular mold or round mold is preferably used. Among these molds, the carbon rectangular mold is preferably used. Contamination of an impurity element can be suppressed, and six surfaces of an ingot can be formed by supplying a raw material to a mold. When a rectangular parallelepiped ingot is formed, a ratio of vertical:horizontal:thickness is preferably (0.5 to 2):(0.5 to 2):1. When a cylindrical ingot is formed, a ratio of radius:thickness is preferably (0.25 to 1):1. For example, when a final solidification portion has a shrinkage cavity, upper and lower surfaces of an ingot may be partially melted by heating the surfaces with a burner or the like, if necessary.

(Primary Forging Step)

The temperature of the ingot obtained by casting is adjusted to a first temperature range of 0.4 Tm to 0.7 Tm (Tm indicates a melting point (K) of the ingot). A method for adjusting the temperature includes a case where the temperature enters the first temperature range in a process in which the ingot obtained by casting is cooled and a case where the temperature enters the first temperature range by heating the temporarily cooled ingot with an electric furnace or the like. In a case of gold (melting point: 1337.33 K), the first temperature range is from 534.9 to 936.1 K, and is preferably from 773.2 to 873.2 K. In a case of platinum (melting point: 2041.4 K), the first temperature range is from 816.6 to 1429.0 K, and is preferably from 1173.2 to 1373.2 K. When the temperature is lower than 0.4 Tm, cracking may occur during a subsequent processing step. When the temperature is higher than 0.7 Tm, the high temperature is maintained even after forging processing as a subsequent step is finished, and therefore recovery or recrystallization occurs, and a introduced distortion is removed.

The ingot obtained by casting is preferably forged using an air hammer. The primary forging step is a pre-molding step for forming an ingot shape in order to facilitate forging from six directions performed in the secondary forging step. The ingot shape in order to facilitate forging from six directions is, for example, a cube or a rectangular parallelepiped. By processing an ingot in this way, it is possible to facilitate processing in the secondary forging step which is a subsequent step. The temperature is preferably in the first temperature range until forging is completed, and forging may be performed while heating is performed, if necessary. A primary forged ingot is obtained through forging.

(Step for Cooling to Second Temperature Range)

Subsequently, the primary forged ingot is cooled to a second temperature range of 0.1 Tm to 0.4 Tm lower than the first temperature range. A method for adjusting the temperature is performed in an air-cooled or water-cooled, but is preferably performed in the water-cooled. The first temperature range and the second temperature range overlap each other at 0.4 Tm. However, when an actual temperature in the first temperature range is 0.4 Tm, an actual temperature in the second temperature range is set to be lower than 0.4 Tm. When the actual temperature in the first temperature range is higher than 0.4 Tm, the actual temperature in the second temperature range is set to be 0.4 Tm or lower. In a case of gold, the second temperature range is from 267.4 to 534.9 K, and is preferably from 323.2 to 473.2 K. In a case of platinum, the second temperature range is from 204.1 to 816.6 K, and is preferably from 573.2 to 773.2 K. When the temperature is lower than 0.1 Tm, cracking may occur during a subsequent step. When the temperature is higher than 0.4 Tm, the high temperature is maintained even after the second forging processing as a subsequent step is finished, and therefore recovery or recrystallization occurs, and a introduced distortion is removed.

(Secondary Forging Step)

Six directions of upper, lower, left, right, front, and rear directions are determined for the cooled primary forged ingot obtained in the primary forging step. How to determine the six directions is arbitrary. However, the upper and lower directions are opposed to each other, the left and right directions are opposed to each other, and the front and rear directions are opposed to each other. The upper and lower directions, the left and right directions, and the front and rear directions are preferably perpendicular to one another. For example, when an ingot is a rectangular parallelepiped, a bottom surface of the rectangular parallelepiped after casting is referred to as a "lower surface", a top surface thereof is referred to as an "upper surface", one of longitudinal side surfaces is referred to as a "front surface", a surface facing the front surface is referred to as a "rear surface", one of short-length side surfaces is referred to as a "left surface", and a surface facing the left surface is referred to as a "right surface".

Subsequently, the cooled primary forged ingot is forged from the six directions in the second temperature range (hereinafter, also referred to as hexagonal forging). The hexagonal forging is preferably performed using an air hammer like in the primary forging step. Forging is preferably performed from the six directions sequentially. Forging preferably includes a step for processing 50 to 80% of the longest side of the ingot. Forging more preferably includes a step for processing 50 to 70% thereof. By performing hexagonal forging in the secondary forging step, a casting defect can be removed and a dissolved structure can be removed to be uniform. Furthermore, a processing distortion is introduced. Thereafter, a forging step such that the side which was longest becomes the longest side again is preferably included. The temperature is preferably in the second temperature range until forging is completed, and forging may be performed while heating or cooling is performed, if necessary. A secondary forged ingot is obtained through forging.

(Cross-Rolling Processing Step)

The temperature of the secondary forged ingot is adjusted to a third temperature range of 0.15 Tm to 0.3 Tm. The second temperature range is a temperature range overlapping the third temperature range. Therefore, when the secondary forged ingot is already in the third temperature range, it is not necessary to adjust the temperature. However, the temperature of the secondary forged ingot is outside the third temperature range, a method for adjusting the temperature is preferably performed in an air-cooled or heating. In a case of gold, the third temperature range is from 200.6 to 401.2 K, and is preferably from 273.2 to 323.2 K. In a case of platinum, the third temperature range is from 306.2 to 612.4 K, and is preferably from 306.2 to 473.2 K. When the temperature is lower than 0.15 Tm, cracking may occur during a subsequent step. When the temperature is higher than 0.3 Tm, a distortion is removed due to recovery or recrystallization. This is not preferable because of a possibility that a crystal grain may be coarsen due to a heat treatment as a subsequent step.

Subsequently, the secondary forged ingot of which temperature has been adjusted to the third temperature range is subjected to cross-rolling processing to form the secondary forged ingot into a target shape. Forming the secondary forged ingot into a target shape is not a main object of the cross-rolling, but a sub-object thereof. The main object is to further introduce a distortion by reducing the thickness while the form is adjusted. Therefore, the processing degree of cross-rolling processing is preferably 50% or more. The processing degree is more preferably from 70 to 90%. By performing such processing in the cross-rolling processing step, formation of a texture biased only toward a specific plane direction can be prevented, and the plane direction can be set at random. A target-shaped ingot is obtained through cross-rolling processing. The processing degree of cross-rolling processing is defined by (plate thickness before processing−plate thickness after processing)÷plate thickness before processing×100.

(Heat Treatment Step)

The target-shaped ingot is subjected to a heat treatment in a fourth temperature range of 0.3 to 0.5 Tm. A method for adjusting the temperature is preferably performed by heating using an electric furnace. In a case of gold, the fourth temperature range is from 401.2 to 668.7 K, and is preferably from 473.2 to 573.2 K. In a case of platinum, the fourth temperature range is from 612.4 to 1020.7 K, and is preferably from 773.2 to 873.2 K. When the temperature is lower than 0.3 Tm, recrystallization does not proceed sufficiently, and an equiaxial crystal cannot be obtained. When the temperature is higher than 0.5 Tm, a crystal grows significantly, and a fine crystal cannot be obtained. Heat treatment time is, for example, preferably from 0.5 to 3 hours, and more preferably from 1 to 2 hours.

The present embodiment defines the first temperature range, the second temperature range, the third temperature range, and the fourth temperature range, but includes a form in which the temperature is outside these temperature ranges during each step thereof. That is, in each step, if time in the first temperature range, the second temperature range, the third temperature range, or the fourth temperature range occupies 50% or more of the total time in each step, it can be said that the temperature is substantially in each of the temperature ranges, and therefore is in the range of the present disclosure. The time preferably occupies 80% or more, more preferably 90% or more of the total time in each step.

The average crystal grain size of a gold or platinum target can be small, from 5 to 50 µm, and the tolerance of the crystal grain size in each of the in-plane direction of the target surface and the thickness direction of the target can be 20% or less through the above steps. Here, the tolerance of 20% or less means that the tolerance is in ±20%, from −20% to +20%.

EXAMPLES

Hereinafter, the present disclosure will be described in more detail by indicating Examples, but the present disclosure is not construed as being limited to Examples.

Example 1

Gold Target

In a high-frequency furnace, 8.5 kg of gold (purity 99.99%) was melted and supplied to a carbon mold to produce a rectangular parallelepiped ingot having a size of (vertical) 150×(horizontal) 120×(thickness) 24.5 mm. This ingot was forged using an air hammer in the first temperature range of 0.609 Tm (541° C.) to 0.430 Tm (302° C.), and 58.7% of a long side was forged to obtain a rectangular parallelepiped ingot having a size of (vertical) 88×(horizontal) 80×(thickness) 62 mm. Thereafter, primary forging was performed by further forging the ingot so as to have a size of (vertical) 123×(horizontal) 123×(thickness) 31 mm to obtain a primary forged ingot. Thereafter, the ingot was cooled with water to obtain a temperature of 0.229 Tm (33.2° C.). In the cooled primary forged ingot, 71.5% of a long side was forged by hexagonal forging to obtain a rectangular parallelepiped ingot having a size of (vertical) 88×(horizontal) 90×(thickness) 55 mm. Thereafter, the ingot was forged and deformed so as to have a size of (vertical) 148×(horizontal) 105×(thickness) 29.5 mm. Secondary forging was performed such that the temperature at this time was 0.323 Tm (159.2° C.) at a maximum by controlling a deformation heat to obtain a secondary forged ingot. Thereafter, the secondary forged ingot cooled to 0.234 Tm (40° C.) was rolled in a rolling machine so as to have a size of (vertical) 270×(horizontal) 290×(thickness) 6.1 mm. At this time, the processing degree of cross-rolling processing was 90%. Cross-rolling processing was performed in a range of 0.228 Tm (32° C.) to 0.243 Tm (52° C.). Finally, a heat treatment was performed at 0.391 Tm (250° C.) for one hour to produce a target.

(Measurement of Crystal Grain Size)

A grain size of the resulting target was measured in accordance with JIS G0551:2013 "Microscope test method of steels-grain size". First, a sample was cut out, and was subjected to mirror polishing with a buff. This sample was subjected to electrolysis using a corrosive liquid obtained by adding 5% alcohol to 1 N hydrochloric acid to make a structure thereof appear. A photograph of the structure was taken with a metal microscope. Five lines were put vertically and horizontally at equal intervals. The number of times of intersection between the lines and grain boundaries (used as the number of crystal grains) was divided by a length of a line segment to calculate a grain size. This work was performed for each of the line segments, and all the grain sizes were averaged to obtain an average grain size in the portion.

Figure 1:
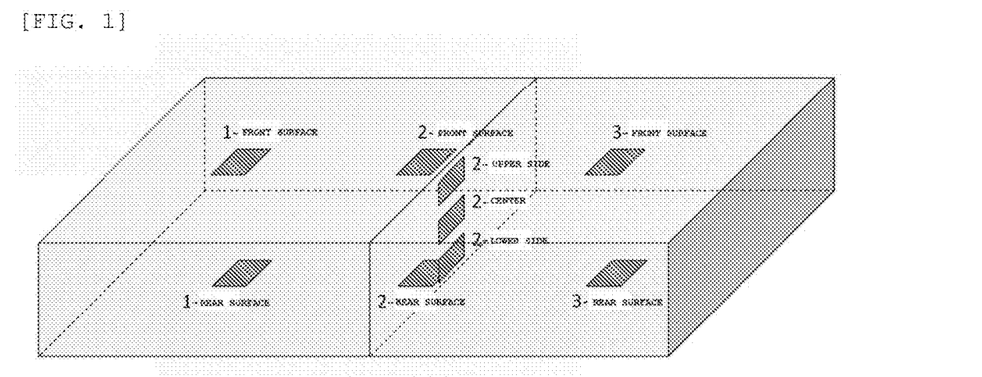
FIG. 1 is a diagram illustrating positions for cutting out an observation sample from a target.

How to cut out a sample was as follows. FIG. 1 illustrates positions for cutting out an observation sample from a target. As illustrated in FIG. 1, three positions (referred to as signs 1, 2, and 3 in FIG. 1) in a longer direction passing through the center in a width direction of the target are cut out. Subsequently, a front surface (referred to as 1-front surface) and a rear surface (referred to as 1-rear surface) of a sample piece with the number 1 are observed. A front surface (referred to as 3-front surface) and a rear surface (referred to as 3-rear surface) of a sample piece with the number 3 are observed. A front surface (referred to as 2-front surface) and a rear surface (referred to as 2-rear surface) of a sample piece with the number 2, and an upper side (referred to as 2-upper side), a center (referred to as 2-center), and a lower side (referred to as 2-lower side) of a cross section transverse in the longer direction of the target are observed.

Figure 2:
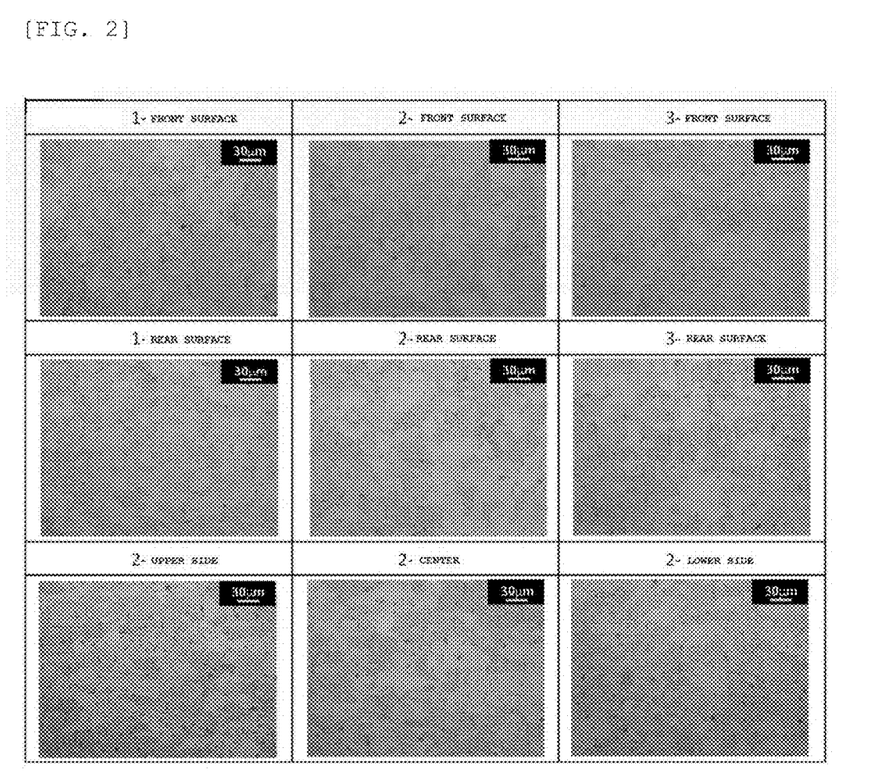
FIG. 2 illustrates an image of a sample of Example 1 with an optical microscope.

FIG. 2 illustrates an image of a sample of Example 1 with an optical microscope. FIG. 2 illustrates results of observing a front surface, a rear surface, and a cross section (three positions in a thickness direction) at three positions of a target by observing a sample cut out according to FIG. 1. FIG. 2 indicates that there is no difference in a crystal grain size among the portions.

Table 1 indicates results of Example 1. An average grain size of the target was 11.7 µm. A tolerance of an average grain size in each portion was −8.97% or +15.81%.

TABLE 1

| | | | | n = 1 | n = 2 | n = 3 | n = 4 | n = 5 | Av. | round (Av.) | ave. (each position) | ave. (1, 2, 3) | ave. (TOT) |
|---|---|---|---|---|---|---|---|---|---|---|---|---|---|
| 1 | front surface | vertical | the number of crystal grains | 16 | 26 | 28 | 17 | 10 | 21 | | | | |
| | | | grain size | 15.6 | 9.6 | 3.9 | 14.7 | 13.9 | 12.5 | 12.5 | | | |
| | | horizontal | the number of crystal grains | 20 | 30 | 29 | 25 | 21 | 25 | | | | |
| | | | grain size | 15.6 | 30.4 | 10.3 | 12.5 | 14.9 | 12.8 | 12.8 | 12.65 | | |
| | rear surface | vertical | the number of crystal grains | 23 | 23 | 21 | 29 | 32 | 23 | | | | |
| | | | grain size | 10.8 | 11.3 | 11.3 | 8.6 | 11.3 | 10.8 | 10.8 | | | |
| | | horizontal | the number of crystal grains | 32 | 25 | 35 | 31 | 30 | 31 | | | | |
| | | | grain size | 9.8 | 12.5 | 8.9 | 10.1 | 10.4 | 10.3 | 10.3 | 10.55 | 11.60 | |
| 2 | front surface | vertical | the number of crystal grains | 21 | 26 | 19 | 18 | 21 | 21 | | | | |
| | | | grain size | 11.9 | 10.4 | 13.1 | 13.1 | 11.9 | 12.1 | 12.1 | | | |
| | | horizontal | the number of crystal grains | 30 | 33 | 29 | 31 | 30 | 31 | | | | |
| | | | grain size | 10.4 | 9.5 | 10.8 | 10.1 | 10.4 | 10.2 | 10.2 | 11.15 | | |

TABLE 1-continued

| | | | | | | | | | | | | |
|---|---|---|---|---|---|---|---|---|---|---|---|---|
| | upper side | vertical | the number of crystal grains | 23 | 25 | 15 | 24 | 24 | 22 | | | |
| | | | grain size | 10.8 | 10.0 | 16.6 | 10.4 | 10.4 | 11.6 | 11.6 | | |
| | | horizontal | the number of crystal graine | 26 | 19 | 29 | 19 | 23 | 23 | | | |
| | | | grain size | 12.0 | 16.4 | 10.8 | 16.4 | 13.6 | 13.9 | 13.9 | 12.75 | |
| | center | vertical | the number of crystal graine | 21 | 23 | 26 | 23 | 19 | 22 | | | |
| | | | grain size | 11.9 | 10.8 | 9.6 | 10.6 | 13.1 | 11.3 | 11.3 | | |
| | | horizontal | the number of crystal graine | 26 | 25 | 24 | 25 | 23 | 25 | | | |
| | | | grain size | 12.0 | 12.5 | 13.0 | 12.5 | 13.6 | 12.7 | 12.7 | 12.00 | |
| | lower side | vertical | the number of crystal graine | 20 | 32 | 27 | 36 | 26 | 30 | | | |
| | | | grain size | 8.9 | 7.8 | 9.2 | 6.9 | 9.6 | 8.5 | 8.5 | | |
| | | horizontal | the number of crystal graine | 23 | 29 | 31 | 30 | 28 | 28 | | | |
| | | | grain size | 13.6 | 10.8 | 10.1 | 10.4 | 11.2 | 11.2 | 11.2 | 9.85 | |
| | rear surface | vertical | the number of crystal graine | 10 | 26 | 24 | 25 | 19 | 22 | | | |
| | | | grain size | 13.9 | 9.6 | 10.4 | 10.0 | 13.1 | 11.4 | 11.4 | | |
| | | horizontal | the number of crystal graine | 27 | 27 | 30 | 30 | 26 | 28 | | | |
| | | | grain size | 11.6 | 11.6 | 10.4 | 10.4 | 12.0 | 11.2 | 11.2 | 11.30 | 11.41 |
| 3 | front surface | vertical | the number of crystal graine | 21 | 20 | 22 | 22 | 21 | 21 | | | |
| | | | grain size | 11.9 | 12.5 | 11.3 | 11.3 | 11.9 | 11.8 | 11.8 | | |
| | | horizontal | the number of crystal graine | 25 | 25 | 27 | 23 | 25 | 25 | | | |
| | | | grain size | 12.5 | 12.5 | 11.6 | 13.6 | 12.5 | 12.5 | 12.5 | 12.15 | |
| | rear surface | vertical | the number of crystal graine | 30 | 27 | 33 | 25 | 29 | 29 | | | |
| | | | grain size | 8.3 | 9.2 | 7.6 | 10.0 | 8.6 | 8.7 | 8.7 | | |
| | | horizontal | the number of crystal graine | 20 | 17 | 21 | 22 | 23 | 21 | | | |
| | | | grain size (grain size/μm) | 15.6 | 18.4 | 14.9 | 14.2 | 13.5 | 15.3 | 15.3 | 12.00 | 12.08 | 11.70 |
| | | | Max | | | 12.75 | | | | tolerance of grain size (Minimum) | | −8.97% | |
| | | | Min | | | 9.05 | | | | tolerance of grain size (Maximum) | | 15.81% | |
| | | | standard deviation | | | 0.96857 | | | | | | | |

Figure 3:
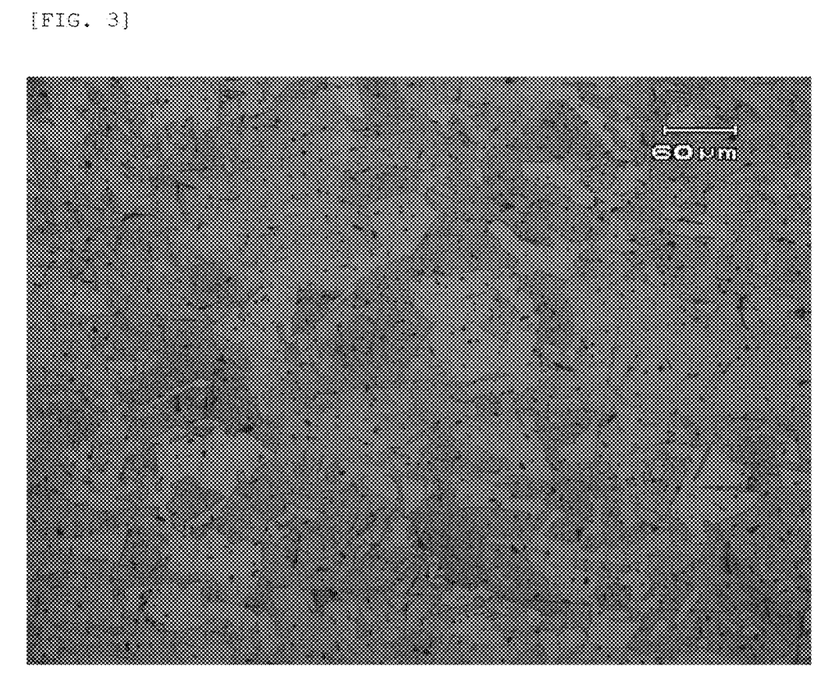
FIG. 3 illustrates an image of a sample of Example 2 with an optical microscope.

A gold target was produced in a similar manner to Example 1 except that the processing degree of cross-rolling processing was 50% and the size of a processed product was (vertical) 174×(horizontal) 174×(thickness) 15.5 mm. A resulting gold target was observed with an optical microscope. A portion observed with an optical microscope was the 2-front surface illustrated in FIG. 1. FIG. 3 illustrates an image with an optical microscope. Thereafter, a grain size in the portion observed with an optical microscope was measured in accordance with JIS G0551:2013 "Microscope test method of steels-grain size". The average crystal grain size was 17 μm.

Example 3

Platinum Target 5.2 kg of platinum (purity 99.99%) was melted in a plasma melting furnace and was supplied to a carbon mold to produce a cylindrical ingot having a size of (diameter) 78×(height) 50 mm. This ingot was forged using an air hammer in the first temperature range of 0.673 Tm (1100° C.) to 0.452 Tm (302° C.) to obtain a rectangular parallelepiped ingot having a size of (vertical) 89×(horizontal) 88×(thickness) 32 mm. Thereafter, primary forging was performed by further forging the ingot so as to have a size of (vertical) 98×(horizontal) 77×(thickness) 33 mm to obtain a primary forged ingot. Thereafter, the ingot was cooled with water to obtain a temperature of 0.146 Tm (24° C.). In the cooled primary forged ingot, 69.4% of a long side was forged by hexagonal forging to obtain a rectangular parallelepiped ingot having a size of (vertical) 87×(horizontal) 89×(thickness) 30 mm. Thereafter, the ingot was forged and deformed so as to have a size of (vertical) 104×(horizontal) 98×(thickness) 25 mm. Secondary forging was performed such that the temperature at this time was 0.350 Tm (442° C.) at a maximum by controlling a deformation heat to obtain a secondary forged ingot. Thereafter, the secondary forged ingot cooled to 0.150 Tm (33° C.) was rolled in a rolling machine so as to have a size of (vertical) 207×(horizontal) 205×(thickness) 5.6 mm. At this time, the processing degree of cross-rolling processing was 76%. Cross-rolling processing was performed in a range of 0.150 Tm (33° C.) to 0.153 Tm (40° C.). Finally, a heat treatment was performed at 0.428 Tm (600° C.) for one hour to produce a target.

(Measurement of Crystal Grain Size)

A grain size of the resulting target was measured in accordance with JIS G0551:2013 "Microscope test method of steels-grain size". First, a sample was cut out, and was subjected to mirror polishing with a buff. This sample was subjected to electrolysis using an aqueous solution obtained by adding 10% hydrochloric acid, a 10% hydrogen peroxide solution, and 10% alcohol as a corrosive liquid to make a structure thereof appear. A photograph of the structure was taken with a metal microscope. Five lines were put vertically and horizontally at equal intervals. The number of times of intersection between the lines and grain boundaries (used as the number of crystal grains) was divided by a length of a line segment to calculate a grain size. This work was performed for each of the line segments, and all the grain sizes were averaged to obtain an average grain size in the portion.

Figure 4:
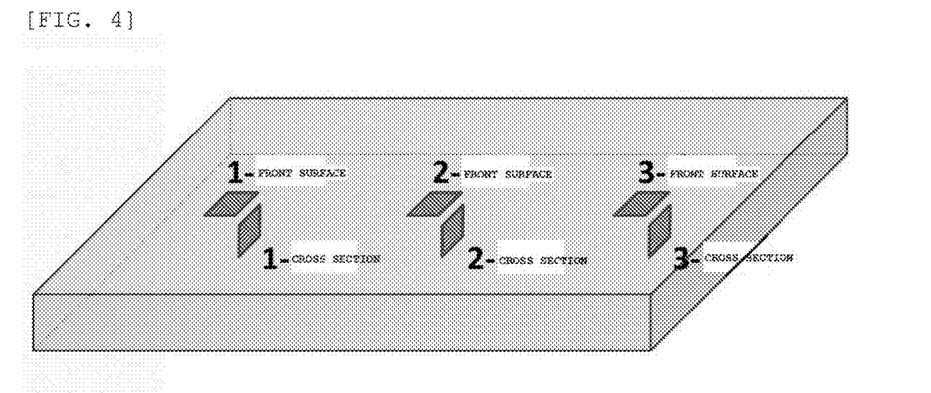
FIG. 4 is a diagram illustrating positions for cutting out an observation sample from a target.

How to cut out a sample was as follows. FIG. 4 illustrates positions for cutting out an observation sample from a target. As illustrated in FIG. 4, three positions (referred to as signs 1, 2, and 3 in FIG. 4) in a longer direction passing through the center in a width direction of the target are cut out. Subsequently, a front surface (referred to as 1-front surface) and a cross section (referred to as 1-cross section) of a sample piece with the number 1 are observed. A front surface (referred to as 2-front surface) and a cross section (referred to as 2-cross section) of a sample piece with the number 2 are observed. A front surface (referred to as 3-front surface) and a cross section (referred to as 3-cross section) of a sample piece with the number 3 are observed.

Figure 5:
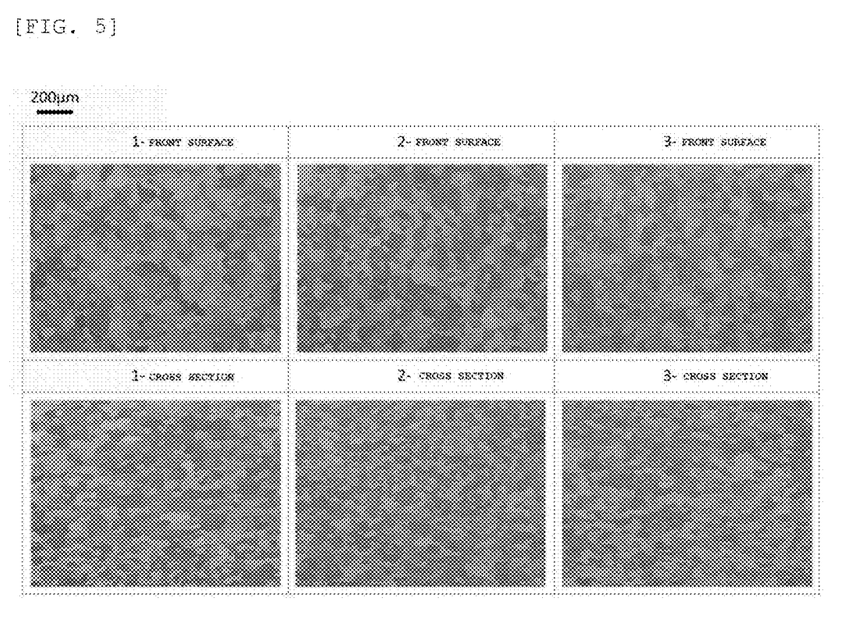
FIG. 5 illustrates an image of a sample of Example 3 with an optical microscope.

FIG. 5 illustrates an image of a sample of Example 3 with an optical microscope. FIG. 5 illustrates results of observing a front surface, a rear surface, and a cross section (three positions in a thickness direction) at three positions of a target by observing a sample cut out according to FIG. 4. FIG. 5 indicates that there is no difference in a crystal grain size among the portions.

Figure 6:
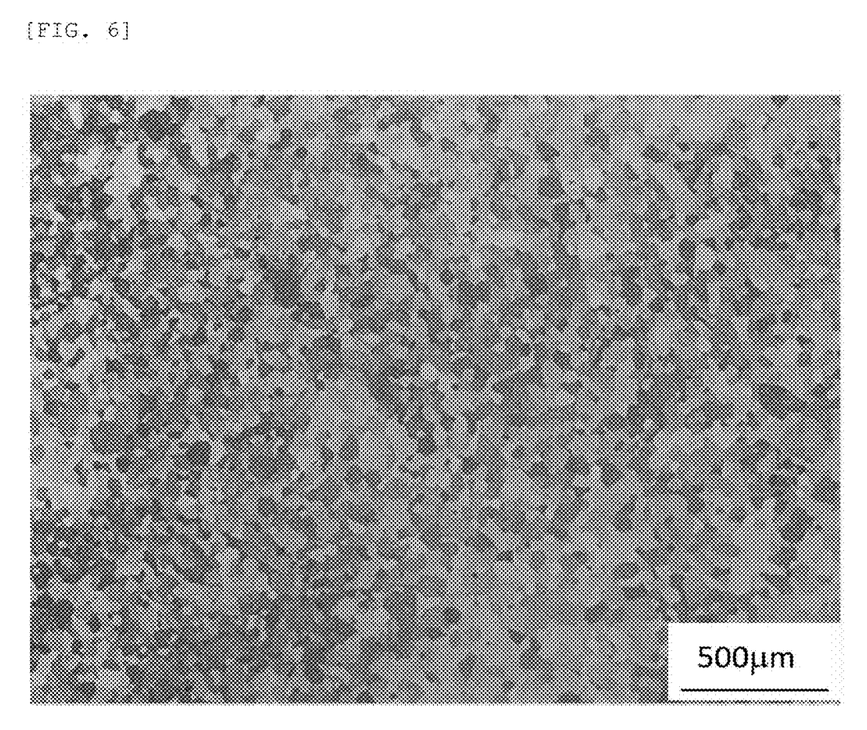
FIG. 6 illustrates an image of a sample of Example 4 with an optical microscope.

Table 2 indicates results of Example 3. An average grain size of a target was 42.8 m. A tolerance of an average grain size in each portion was −5% or +8%.

trates an image with an optical microscope. Thereafter, a grain size in the portion observed with an optical microscope was measured in accordance with JIS G0551:2013 "Microscope test method of steels-grain size". The average crystal grain size was 37 μm.

Example 5

Figure 7:
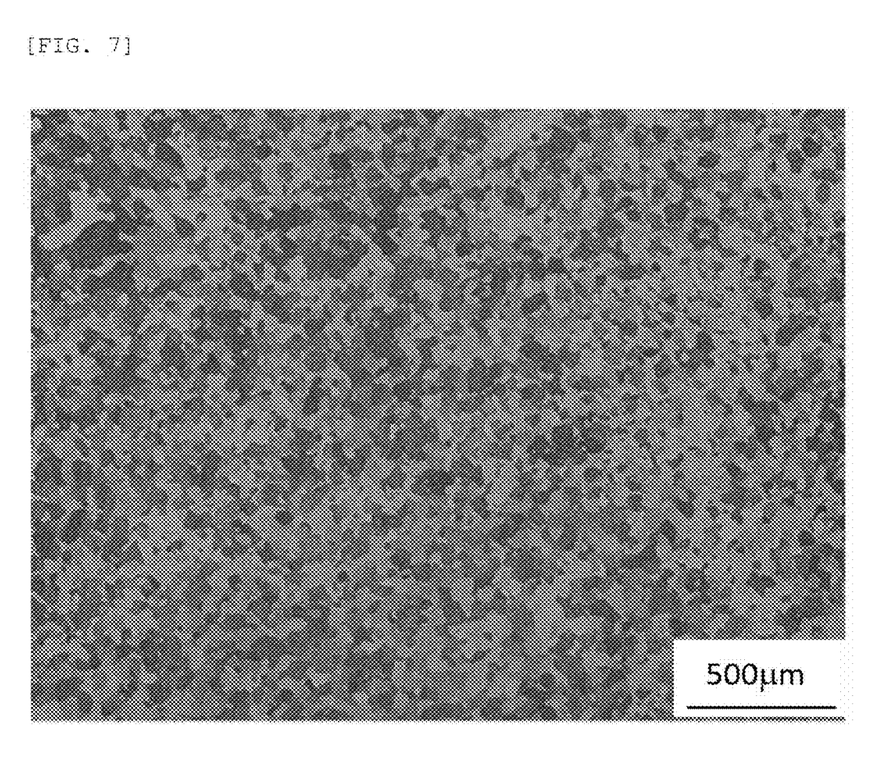
FIG. 7 illustrates an image of a sample of Example 5 with an optical microscope.

A platinum target was produced in a similar manner to Example 3 except that the processing degree of cross-rolling processing was 90%, the size of a processed product was (vertical) 310×(horizontal) 244×(thickness) 3.3 mm, and the heat treatment temperature was 0.379 Tm (500° C.). A resulting platinum target was observed with an optical microscope. A portion observed with an optical microscope was the 2-front surface illustrated in FIG. 4. FIG. 7 illustrates an image with an optical microscope. Thereafter, a grain size in the portion observed with an optical microscope was measured in accordance with JIS G0551:2013 "Microscope test method of steels-grain size". The average crystal grain size was 26 μm.

Comparative Example 1

Figure 8:
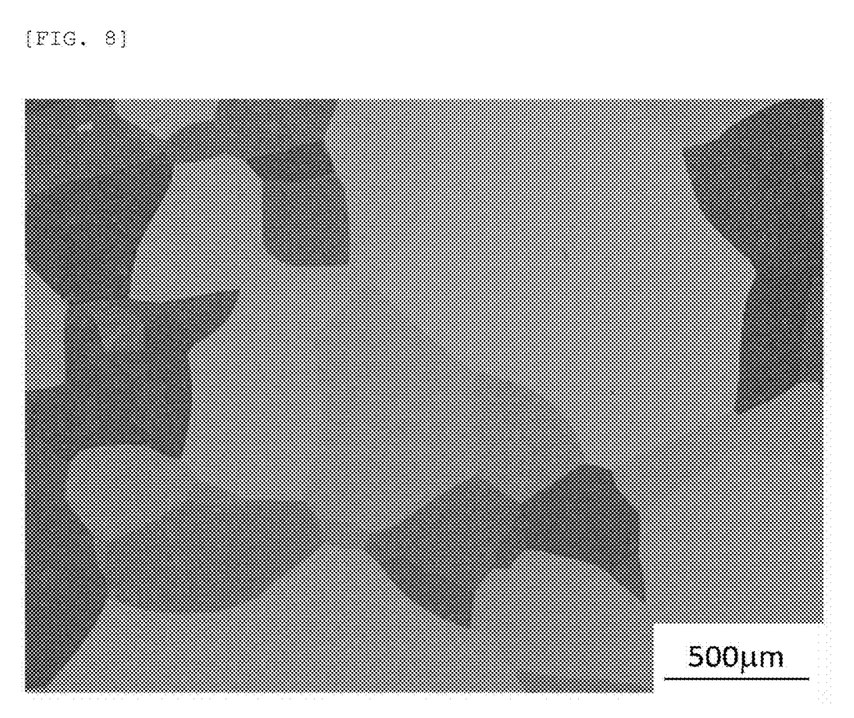
FIG. 8 illustrates an image of a sample of Comparative Example 1 with an optical microscope.

A platinum target was produced in a similar manner to Example 3 except that the final heat treatment temperature was 0.575 Tm (900° C.). Apart of the resulting platinum target was observed with an optical microscope. FIG. 8 illustrates an image with an optical microscope. Thereafter, a grain size in the portion observed with an optical microscope was measured in accordance with JIS G0551:2013 "Microscope test method of steels-grain size". The average crystal grain size was 364 μm.

TABLE 2

|   |   |   | measured value of crystal grain size (μm) | | | | | average grain size (μm) | | |
|---|---|---|---|---|---|---|---|---|---|---|
|   |   |   |   |   |   |   |   | each grain | each sample | each position | average value of all grains |
|   |   |   | n = 1 | n = 2 | n = 3 | n = 4 | n = 5 | | | | |
| 1 | front surface | vertical | 39.9 | 32.2 | 39.9 | 34.4 | 38.4 | 36.9 | 41.7 | 42.2 | 42.8 |
|   |   | horizontal | 50.7 | 44.2 | 42.8 | 45.7 | 48.9 | 46.5 | | | |
|   | cross section | vertical | 41.6 | 36.9 | 35.6 | 39.9 | 41.6 | 39.1 | 42.6 | | |
|   |   | horizontal | 47.2 | 40.3 | 50.7 | 41.5 | 50.7 | 46.1 | | | |
| 2 | front surface | vertical | 47.5 | 34.4 | 32.2 | 34.4 | 35.6 | 36.8 | 41.2 | 42.8 | |
|   |   | horizontal | 45.7 | 47.2 | 39.1 | 48.9 | 47.2 | 45.6 | | | |
|   | cross section | vertical | 45.3 | 35.6 | 39.9 | 55.4 | 43.4 | 43.9 | 44.5 | | |
|   |   | horizontal | 50.7 | 42.8 | 41.5 | 45.7 | 44.2 | 45.0 | | | |
| 3 | front surface | vertical | 30.2 | 26.2 | 32.2 | 34.4 | 47.5 | 34.1 | 40.4 | 43.3 | |
|   |   | horizontal | 42.8 | 47.2 | 50.7 | 44.2 | 48.9 | 46.8 | | | |
|   | cross section | vertical | 45.3 | 41.6 | 47.5 | 43.4 | 47.5 | 45.0 | 46.2 | | |
|   |   | horizontal | 45.7 | 44.2 | 41.5 | 54.8 | 50.7 | 47.4 | | | |
| maximum grain size | | 46.2 μm | tolerance (maximum) of grain (minimum) size | | | | | 8% | | | |
| minimum grain size | | 40.4 μm | | | | | | −5% | | | |
| standard deviation | | 6.3 | | | | | | | | | |

Example 4

A platinum target was produced in a similar manner to Example 3 except that the processing degree of cross-rolling processing was 50% and the size of a processed product was (vertical) 139×(horizontal) 109×(thickness) 16.5 mm. A resulting platinum target was observed with an optical microscope. A portion observed with an optical microscope was the 2-front surface illustrated in FIG. 4. FIG. 6 illus- Comparative Example 2

Figure 9:
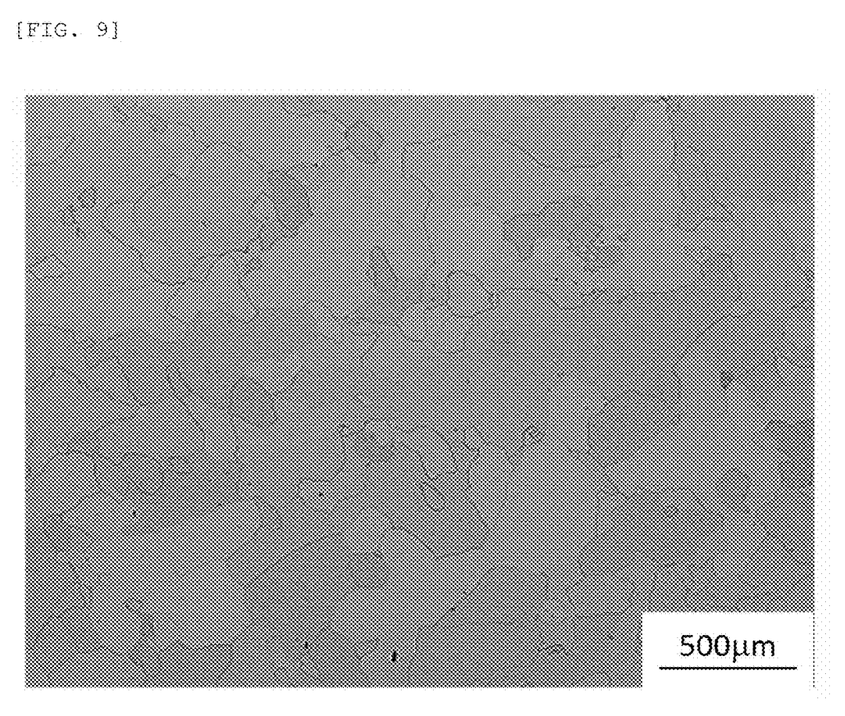
FIG. 9 illustrates an image of a 1-front surface of a sample of Comparative Example 2 with an optical microscope.
Figure 10:
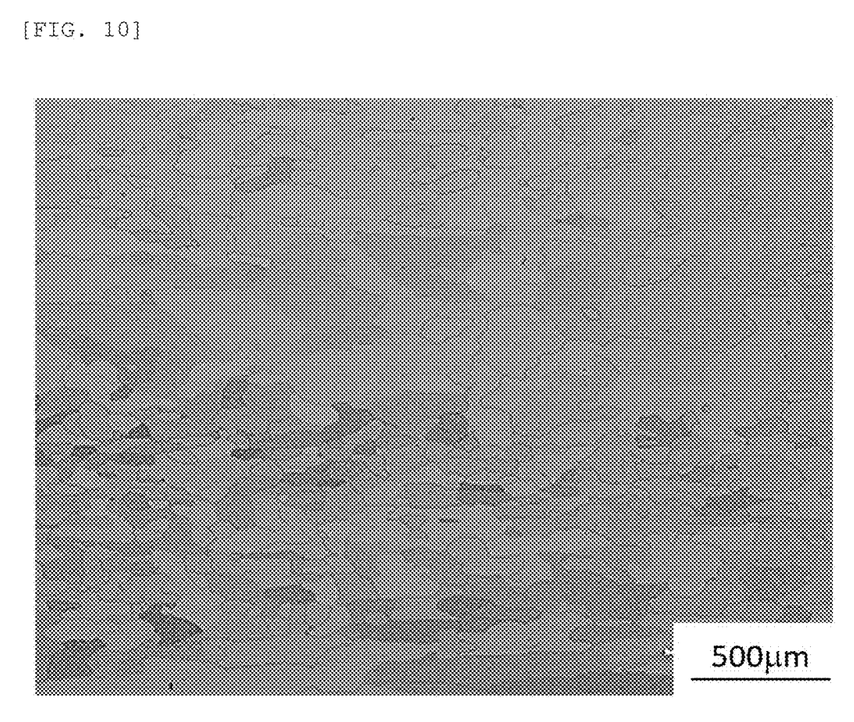
FIG. 10 illustrates an image of a 1-cross section of a sample of Comparative Example 2 with an optical microscope.

A platinum target was produced in a similar manner to Example 3 except that the ingot after the primary forging without the secondary forging (the shape of the ingot was (vertical) 104×(horizontal) 104×(thickness) 26 mm) was subjected to cross-rolling processing using a rolling machine. The resulting platinum target was observed with an optical microscope. Portions observed with an optical microscope were the 1-front surface and the 1-cross section illustrated in FIG. 4. FIG. 9 illustrates an image of the 1-front surface with an optical microscope. FIG. 10 illustrates an image of the 1-cross section with an optical microscope. Thereafter, a grain size in the portion observed with an optical microscope was measured in accordance with JIS G0551:2013 "Microscope test method of steels-grain size". The average crystal grain size of the 1-front surface was 138 µm, and the average crystal grain size of the 1-cross section was 95 µm. It was confirmed that the structure had low uniformity.

The invention claimed is:

1. A method for producing a gold or platinum target, comprising:
   an ingot production step for casting molten gold or platinum to obtain an ingot;
   a primary forging step for forging the ingot obtained by casting in a first temperature range of 0.4 Tm to 0.7 Tm (Tm indicates a melting point (K) of the ingot);
   a step for cooling the primary forged ingot obtained in the primary forging step to a second temperature range of 0.1 Tm to 0.4 Tm lower than the first temperature range;
   a secondary forging step for determining six directions of upper, lower, left, right, front, and rear directions for the cooled primary forged ingot and further forging the cooled primary forged ingot from the six directions in the second temperature range;
   a cross-rolling processing step for adjusting the secondary forged ingot obtained in the secondary forging step to a third temperature range of 0.15 Tm to 0.3 Tm and subjecting the secondary forged ingot to cross-rolling processing to form the secondary forged ingot into a target shape; and
   a heat treatment step for heat-treating the target-shaped ingot obtained in the cross-rolling processing step in a fourth temperature range of 0.3 to 0.5 Tm.

2. The method for producing a gold or platinum target according to claim 1, wherein forging performed in the primary forging step is a pre-molding step for forming an ingot shape in order to facilitate forging from the six directions performed in the secondary forging step.

3. The method for producing a gold or platinum target according to claim 2, wherein, in forging from the six directions performed in the secondary forging step, 50 to 80% of the longest side of the ingot is processed.

4. The method for producing a gold or platinum target according to claim 2, wherein, in the cross-rolling processing step, the processing degree of cross-rolling processing is 50% or more.

5. The method for producing a gold or platinum target according to claim 2, wherein the average crystal grain size of the gold or platinum target obtained in the heat treatment step is from 5 to 50 µm, and a tolerance of the crystal grain size in each of the in-plane direction of the target surface and the thickness direction of the target is controlled to be 20% or less.

6. The method for producing a gold or platinum target according to claim 1, wherein, in forging from the six directions performed in the secondary forging step, 50 to 80% of the longest side of the ingot is processed.

7. The method for producing a gold or platinum target according to claim 6, wherein, in the cross-rolling processing step, the processing degree of cross-rolling processing is 50% or more.

8. The method for producing a gold or platinum target according to claim 6, wherein the average crystal grain size of the gold or platinum target obtained in the heat treatment step is from 5 to 50 µm, and a tolerance of the crystal grain size in each of the in-plane direction of the target surface and the thickness direction of the target is controlled to be 20% or less.

9. The method for producing a gold or platinum target according to claim 1, wherein, in the cross-rolling processing step, the processing degree of cross-rolling processing is 50% or more.

10. The method for producing a gold or platinum target according to claim 4, wherein the average crystal grain size of the gold or platinum target obtained in the heat treatment step is from 5 to 50 µm, and a tolerance of the crystal grain size in each of the in-plane direction of the target surface and the thickness direction of the target is controlled to be 20% or less.

11. The method for producing a gold or platinum target according to claim 1, wherein the average crystal grain size of the gold or platinum target obtained in the heat treatment step is from 5 to 50 µm, and a tolerance of the crystal grain size in each of the in-plane direction of the target surface and the thickness direction of the target is controlled to be 20% or less.

* * * * *